(12) United States Patent
Li

(10) Patent No.: US 7,684,448 B2
(45) Date of Patent: Mar. 23, 2010

(54) METHOD AND APPARATUS FOR DATA INTERLEAVING AND DATA DE-INTERLEAVING AGAINST PERIODICAL POSITION INTERFERENCE

(75) Inventor: Huajia Li, Guangdong (CN)

(73) Assignee: Huawei Technologies Co., Ltd., Shenzhen (CN)

(*) Notice: Subject to any disclaimer, the term of this patent is extended or adjusted under 35 U.S.C. 154(b) by 457 days.

(21) Appl. No.: 11/626,896

(22) Filed: Jan. 25, 2007

(65) Prior Publication Data

US 2007/0195739 A1 Aug. 23, 2007

Related U.S. Application Data

(63) Continuation of application No. PCT/CN2005/001130, filed on Jul. 27, 2005.

(30) Foreign Application Priority Data

Jul. 27, 2004 (CN) .................... 2004 1 0054670

(51) Int. Cl.
*H04J 3/04* (2006.01)
(52) U.S. Cl. ..................... 370/535; 370/470
(58) Field of Classification Search ............ 370/470, 370/535
See application file for complete search history.

(56) References Cited

U.S. PATENT DOCUMENTS 7,035,284 B2 * 4/2006 Willenegger et al. ........ 370/470

7,193,972 B1 * 3/2007 Nakamura et al. .......... 370/252
2004/0100918 A1 * 5/2004 Toskala et al. ............. 370/314

FOREIGN PATENT DOCUMENTS

| CN | 1347213 | 5/2002 |
|----|---------|--------|
| EP | 0892501 | 1/1999 |
| EP | 1100204 | 5/2001 |
| JP | 2000-101478 | 4/2000 |

(Continued)

OTHER PUBLICATIONS

Song Huishi, et al; "DSP Fast Implementation Solution for Downlink Service Multiplexing in WCDMA System", WCDMA BTS "863", 2003.

(Continued)

*Primary Examiner*—Derrick W Ferris
*Assistant Examiner*—Jason Levelle
(74) *Attorney, Agent, or Firm*—Finnegan, Henderson, Farabow, Garrett & Dunner LLP

(57) ABSTRACT

A method for data interleaving and data de-interleaving against periodical position interference, the process of data interleaving includes: multiplexing data of different transport channels, interleaving the data multiplexed, and outputting the data interleaved; the process of data de-interleaving includes: receiving the data interleaved, de-interleaving the data received, and de-multiplexing the data de-interleaved into different transport channels; performing a randomized operation in the process of the data interleaving and an inverse operation of the randomized calculation in the process of the data de-interleaving to make the outputted position of the data of different transport channels after the interleaving be random. It may be avoided by applying the present invention that all synchronization interference signals in a wireless channel are concentrated in the data of the same transport channel.

5 Claims, 5 Drawing Sheets

FOREIGN PATENT DOCUMENTS

| | | |
|---|---|---|
| WO | WO 00/64073 | 10/2000 |
| WO | WO 01/82489 | 11/2001 |
| WO | WO 0232079 A1 * | 4/2002 |
| WO | WO 03/079601 | 9/2003 |
| WO | WO 2004/030226 | 4/2004 |

OTHER PUBLICATIONS

3GPP TS 25.212 V5.4.0 (Feb. 2003) $3^{rd}$ Generation Partnership Project; Technical Specification Group Radio Access Network; Multiplexing and channel coding (FDD) (Release 5).

* cited by examiner

METHOD AND APPARATUS FOR DATA INTERLEAVING AND DATA DE-INTERLEAVING AGAINST PERIODICAL POSITION INTERFERENCE

FIELD OF THE TECHNOLOGY

The present invention relates to wireless channel coding and interleaving technologies, and more particularly, to a method and apparatus for data interleaving and data de-interleaving against periodical position interference.

BACKGROUND OF THE INVENTION

In a communication system based on the Wideband Code Division Multiple Access (WCDMA) technologies, there are dedicated channels and common channels. The common channels include a common pilot channel and a paging channel. The dedicated channels used by different users share the same time slot and the same frequency band with most of the common channels. In general, theses dedicated channels and common channels are transmitted synchronously and are distinguished from each other by disrelated "codes", such as Orthogonal Variable length Spreading Frequency (OVSF) codes. At a receiver end, supposing that there is no multi-path and the synchronization is accurate when demodulating, the channels using the orthogonal codes do not interfere with each other.

However, some channels do not use codes orthogonal to those of other channels and do not occupy the whole time slot. For example, as shown in FIG. 1, a primary/secondary synchronization signal occupies the first 256 chips of each time slot. Thus, the primary/secondary synchronization signal is a sequence with period of a time slot and a duty ratio of 255/2560=1/10. Since not using the orthogonal code, the primary/secondary synchronization signal is an interference with period of a time slot to signals of other channels in the wireless channel.

FIG. 2 is a flowchart illustrating the framing of downlink data to be transmitted to a wireless channel. After multiplexing of different transport channels and before being sent to the wireless channel, data from different transport channels need a $2^{nd}$ interleaving to disturb sequence therebetween. The $2^{nd}$ interleaving will be hereinafter introduced briefly. Refer to 3 GPP TS25.212 V5.4.0 for details.

The process of the $2^{nd}$ interleaving mainly includes: writing data into a matrix with size of N×30 row by row first; permuting columns of the matrix and reading the data from the matrix column by column. The rule of the inter-column permutation is listed as follows: supposing that the original order of the columns are 0, 1, 2, ..., 29, the order of the columns after inter-column permutation is <0, 20, 10, 5, 15, 25, 3, 13, 23, 8, 18, 28, 1, 11, 21, 6, 16, 26, 4, 14, 24, 19, 9, 29, 12, 2, 7, 22, 27, 17>.

The $2^{nd}$ interleaving is hereinafter described with reference to the schematic diagrams of data transmission shown in FIG. 2 and FIG. 3, and take the multiplexing of three transport channels A, B, and C in the WCDMA system to a physical channel as an example. Supposing that the data of the three transport channels are A1~A30, B31~B90 and C91~C180, respectively, the process of the $2^{nd}$ interleaving includes:

a channel multiplexing unit multiplexes the transport channels, A, B and C to get data <A1, A2~A30, B31, B32~B90, C91, C92~C180>, which is to be interleaved with the $2^{nd}$ interleaving.

Then, write the data into an interleaving matrix of an interleaving memory row by row and get a matrix as follows:

$$\begin{array}{cccccc} 0 & 1 & 2 & \ldots & 28 & 29 \\ \begin{bmatrix} A1 & A2 & A3 & \ldots & A29 & A30 \\ B31 & B32 & B33 & \ldots & B59 & B60 \\ B61 & B62 & B63 & \ldots & B89 & B90 \\ C91 & C92 & C93 & \ldots & C119 & C120 \\ C121 & C122 & C123 & \ldots & C149 & C150 \\ C151 & C152 & C153 & \ldots & C179 & C180 \end{bmatrix} \end{array}$$

Perform the inter-column permutation of the matrix and get an output as follows:

$$\begin{array}{cccccc} 0 & 20 & 10 & \ldots & 27 & 17 \\ \begin{bmatrix} A1 & A21 & A31 & \ldots & A28 & A18 \\ B31 & B51 & B41 & \ldots & B58 & B48 \\ B61 & B81 & B71 & \ldots & B88 & B78 \\ C91 & C111 & C101 & \ldots & C118 & C108 \\ C121 & C141 & C131 & \ldots & C148 & C138 \\ C151 & C171 & C161 & \ldots & C178 & C168 \end{bmatrix} \end{array}$$

Then, read the data from the interleaving matrix of the interleaving memory column by column and send the data to the wireless channel. The data read from the interleaving matrix is shown as follows.

$$< A1B31B61C91C121C151 \quad A21B51B81C111C141C171 \quad \ldots \quad A18B48B78C108C138C168 >$$

Through analyzing the above interleaving process, it can be seen from the interleaving matrix: after the data of the three transport channels are sequentially written into the interweaving matrix, the data of the transport channel A are written into the beginning several rows of the interleaving matrix, the data of the transport channel B are written into the next several rows, and the data of the transport channel C are written into the further next several rows. The above inter-column permutation cannot change such a layout of the data. Furthermore, when the data of the interweaving matrix are read column by column, each data frame read includes 30 groups of array of "data of the transport channel A+data of the transport channel B+data of the transport channel C" because of the layout.

In the WCDMA system, each data frame is composed of 15 time slots while the data read from the interweaving matrix have 30 groups. Thus, each group corresponds to a half time slot in a frame. A diagram illustrating the relationship between data distribution and data period is shown in FIG. 4 which is obtained according to the distribution of the positions of the transport channels A, B and C in each group.

On the other hand, as described above, the primary/secondary synchronization signal in the WCDMA system forms a burst interference with period of a time slot. As shown in FIG. 5, which is a diagram illustrating the relationship of the data and the primary/secondary synchronization signal, the interference becomes an interference sequence to the wireless channel. Thus, when a mobile station receives, through the wireless channel, a signal interfered by the primary/secondary synchronization signal, after each transport channel is demultiplexed, it is probable that all the interference brought by the primary/secondary synchronization signal occurs in one transport channel. As a result, the performance of the transport channel affected by the interference is deteriorated. Thus, subsequent de-coding is deteriorated and even the communication quality is influenced, such as link break up.

SUMMARY OF THE INVENTION

An Embodiment of the present invention provides a method for data interleaving and data de-interleaving against periodical position interference, so as to prevent a synchronization interference signal in a wireless channel from being all concentrated into data of a same transport channel.

According to an embodiment of the present invention, the method for data interleaving and data de-interleaving against periodical position interference includes:

a process of data interleaving and a process of data de-interleaving;

the process of data interleaving includes: multiplexing data of different transport channels, interleaving the data multiplexed, and outputting the data interleaved;

the process of data de-interleaving includes: receiving, the data interleaved, de-interleaving the data received, and de-multiplex the data de-interleaved into different transport channels;

performing a randomized operation in any process of multiplexing data of different channels and interleaving the data multiplexed;

performing a corresponding inverse operation of the randomized operation in any process of de-interleaving the data received and de-multiplexing the data de-interleaved into different transport channels.

A method for data interleaving includes:

multiplexing data of different transport channels, interleaving the data multiplexed, and outputting the data interleaved;

performing a randomized operation in any process of multiplexing data of different transport channels and interleaving the data multiplexed.

An apparatus for data interleaving includes:

a channel multiplexing unit, configured to multiplex data of different transport channels through a randomized operation;

an interleave, configured to receive data multiplexed from the channel multiplexing unit, interleave the data received and output the data interleaved.

An apparatus for data interleaving includes:

a plurality of interleavers, concatenated with each other, configured to interleave data through a randomized operation and output the data interleaved.

As can be seen from the above method, in the embodiments of the present invention, through alternately reading data from the transport channels, it may be avoided that the interleaved data presents simple periodical relationships between positions of data of different transport channels. Thus, the data interfered by the synchronization channel during the wireless transmission may not concentrate in the same transport channel after de-interleaving and de-multiplexing of the transport channel. Thereby, the affection of the periodical interference in the wireless channel on performance of de-coding after the de-interleaving is depressed and thus, the overall performance of the wireless link is improved.

EMBODIMENTS OF THE INVENTION

In the embodiments of the present invention, outputted positions of data of different transport channels after interleaving are randomized instead of simple iteration of periodical positions by introducing a randomization calculation. Thus, the synchronization interference may be avoided.

The present invention is hereinafter described in detail with reference to the embodiments and accompanying drawings.

Figure 1:
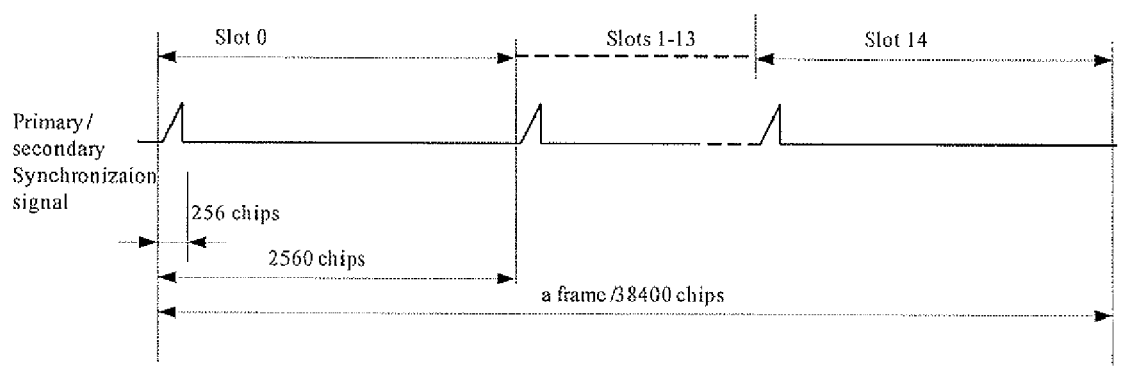
FIG. 1 is a schematic diagram of a primary/secondary synchronization signal.
Figure 2:
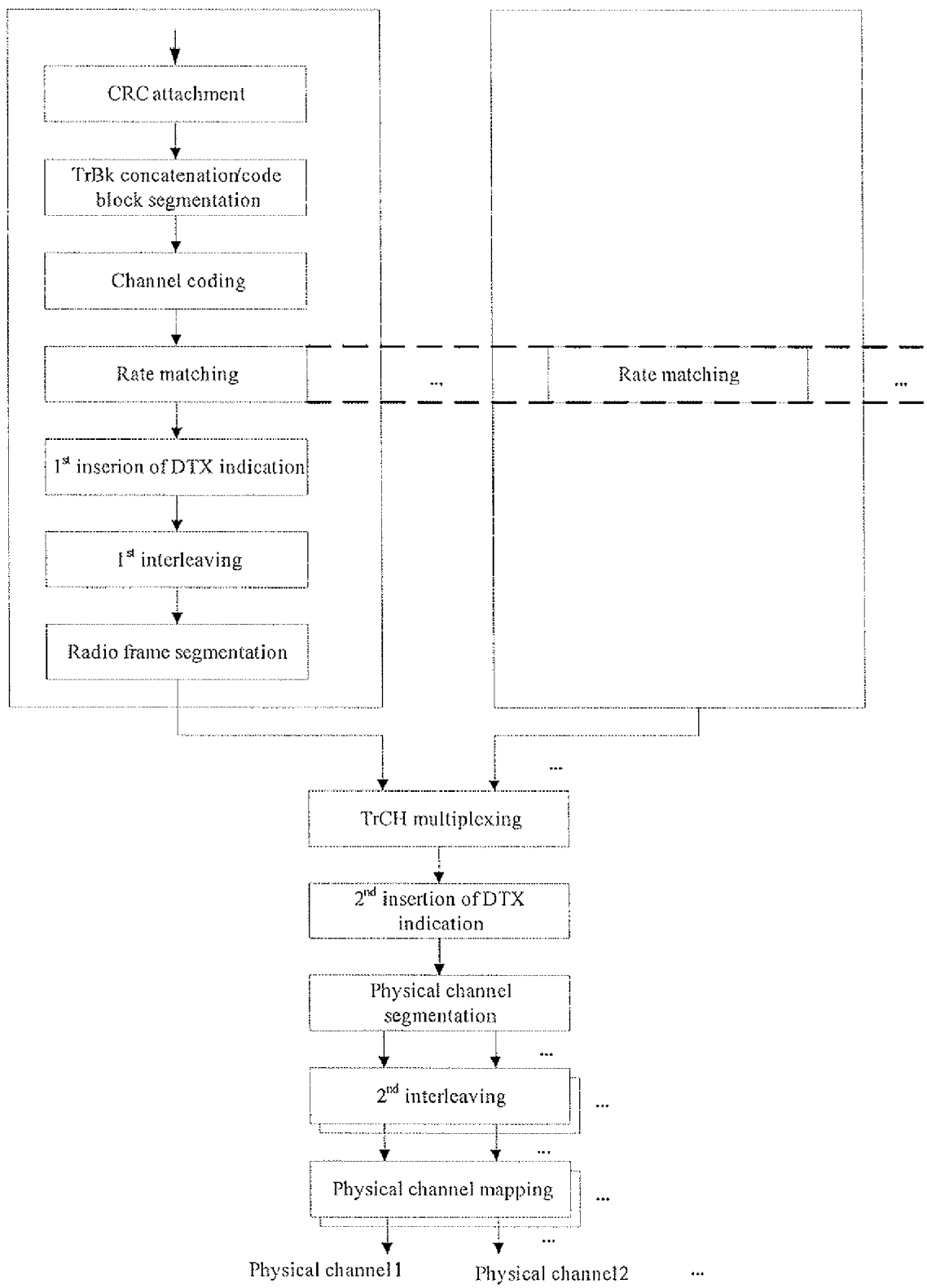
FIG. 2 is a flowchart illustrating the framing of downlink data to be transmitted to a wireless channel.
Figure 3:
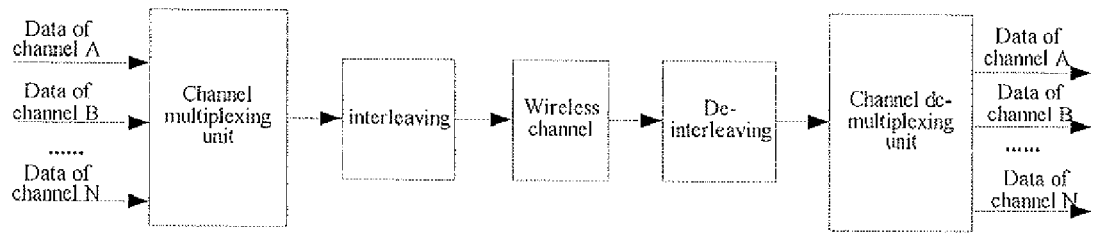
FIG. 3 is a schematic diagram of the data transmission according to an embodiment of the present invention.
Figure 4:
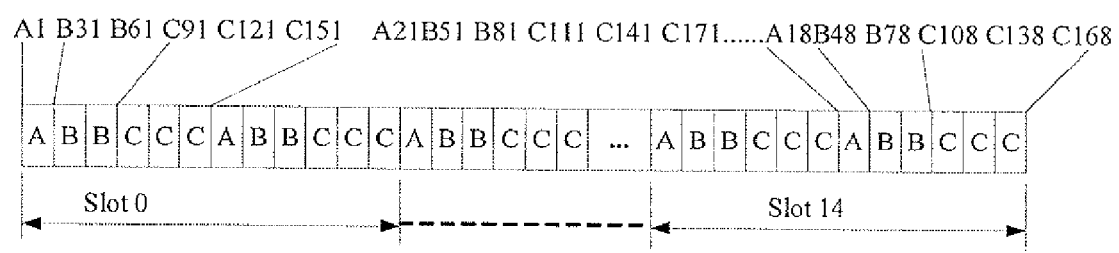
FIG. 4 is a schematic diagram illustrating the relationship between data distribution and data period according to an embodiment of the present invention.
Figure 5:
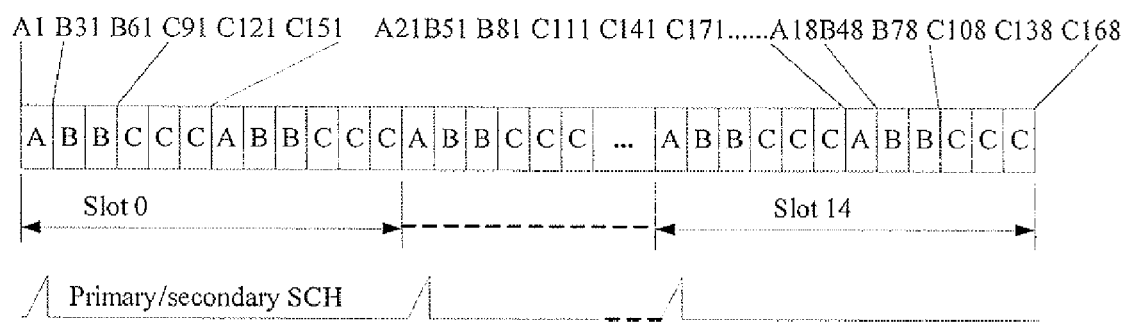
FIG. 5 is a diagram illustrating the relationship of the data and the primary/secondary synchronization signal according to an embodiment of the present invention.
Figure 6:
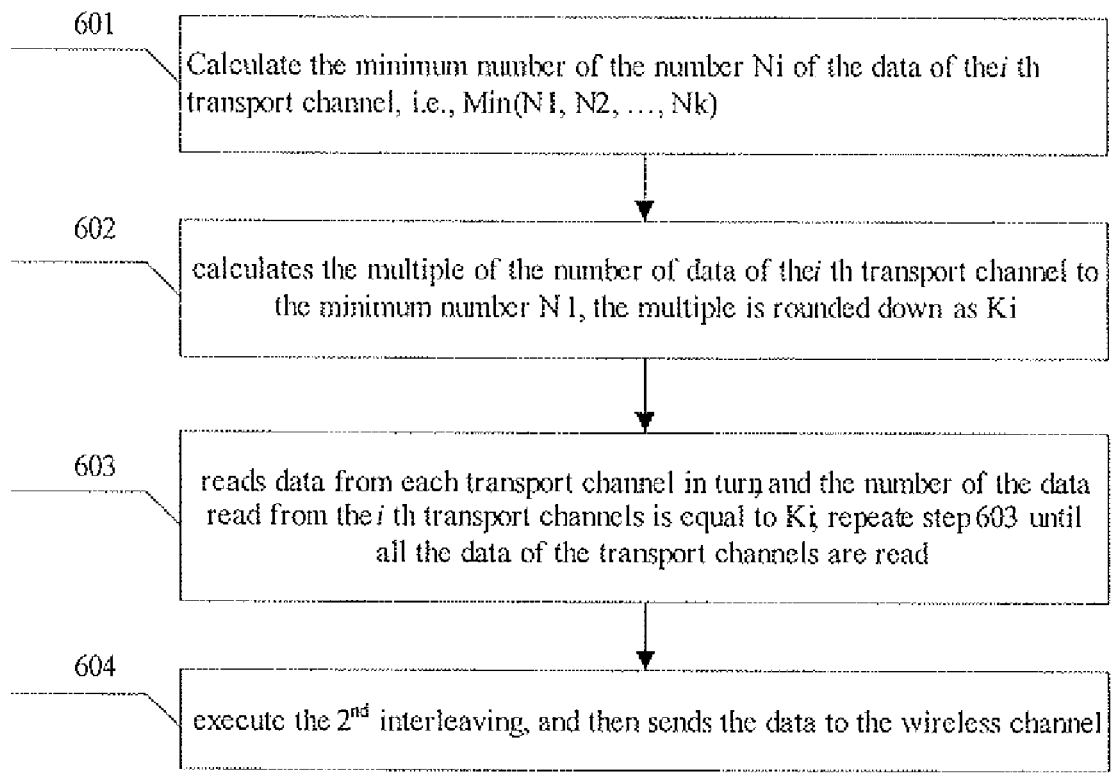
FIG. 6 is a flowchart of data transmission according to an embodiment of the present invention.

The method for data interleaving and data de-interleaving in accordance with an embodiment of the present invention is hereinafter described with reference to the flowchart shown in FIG. 6. In this embodiment, the process of reading data after transport channel multiplexing as described in the background of the invention is replaced by a process of reading data from each transport channel and taking the data read as the data to be interleaved, so that the data to be inputted into the interleaving matrix have no orderliness as described in the background of the invention. Thus, it may be avoided that the synchronization interference is concentrated in one transport channel. Supposing that there are k transport channels and the number of data of the ith transport channel is Ni, i=1~k, respectively, the method includes the steps of:

Step 601: a channel multiplexing unit calculates the minimum number Nmin of the numbers of data of each transport channel, Nmin=Min (N1, N2, . . . , Nk). In this embodiment, it is supposed that Nmin=Min (N1, N2, . . . Nk)=N1, i.e., N1 is the minimum number.

Step 602: the channel multiplexing unit calculates, according the following formula, the multiple of the number of data of the ith transport channel to the minimum number N1, the multiple gets rounded down to Ki.

$Ki=\lfloor Ni/Nmin \rfloor = \lfloor Ni/N1 \rfloor$, $i=1\sim K$. where $\lfloor \ \rfloor$ denotes a rounding down operation.

Step 603: the channel multiplexing unit reads data from each transport channel in turn, and the number of the data read from the i th transport channel is equal to Ki; repeat step 603 until all the data of the transport channels are read. The data read from the transport channels are taken as the data to be interleaved. The specific process of reading data from each transport channel is described as follows:

read data from the transport channel 1, the number of data read from the transport channel 1 is equal to K1, read data from the transport channel 2, the number of data read from the transport channel 2 is equal to K2, . . . , read data from the transport channel k, the number of data read from the transport channel k is equal to Kk, . . . . And return to the transport channel 1, read data from the transport channel 1, the number of data read from the transport channels is equal to k1 . . . , during reading step, when the number of data remained of a transport channel, such as the i th transport channel, is smaller than Ki, read the data remained; and when a transport channel has no data to be read, pass the transport channel and proceed to the next transport channel until all the data of the transport channels are read.

Step 604: the channel multiplexing unit sends the data read in Step 603 to the interweaving matrix to execute the $2^{nd}$ interleaving, and then sends the data to the wireless channel.

The data read according to the above Step 603 are data from transport channels with disturbed orders. Therefore, the problem of periodicity does not exist after the $2^{nd}$ interleaving, i.e., when the transmission in the wireless channel is affected by the synchronization interference, the interference may hot concentrate in the data of one transport channel.

A data receiver may perform an inverse operation of the method above when de-multiplexing the transport channels. The inverse operation is hereinafter described. For each transport channel, the number of data to be received is known, and the de-multiplexing of the transport channels includes:

the channel de-multiplexing unit de-interleaves the data received, and then calculates Ki following the Steps 601 and 602;

the channel de-multiplexing unit, i.e., the receiver, reads data from the data de-interleaved, the number of the data read from the data de-interleaved being from K1 to Kk in turn, then writes the data read into the transport channels with number of 1 to k respectively. Repeat this step until all the data are written into the transport channels. The specific process of writing data into each transport channel is given as follows:

read data from the data de-interleaved, the number of the data read is K1, write the data read into the transport channel 1, then read data from the data de-interleaved, the number of the data read is K2, write the data read into the transport channel 2, . . . , read data from the data de-interleaved, the number of the data read is Kk, write the data read into the transport channel k; then read data from the data de-interleaved, the number of the data read is K1, write the data read into the transport channel 1, read data from the data de-interleaved, the number of the data read is K2, . . . . When the number of data of a transport channel, such as the i th transport channel, to be written is smaller than Ki, write the data to be written into the transport channel Ki; when a transport channel has no data to be written, pass the transport channel and proceed to the next transport channel until all the data are written into the de-multiplexed transport channels.

The method is hereinafter further described in detail in accordance with an embodiment. For convenience, supposing that the number K of the transport channels is 3 and the number Ni of the data of each transport channel are 2, 5 and 6, respectively. The data of the transport channel 1 are denoted as A1 and A2, the data of the transport channel 2 are denoted as B1, B2 and B3, and the data of the transport channel 3 are denoted as C1, C2, C3, C4, C5 and C6.

First, the channel multiplexing unit calculates the Nmin according to the formula in Step 601, i.e., Nmin=Min (2, 5, 6), and figures out that the Nmin equals to the number of data of the transport channel 1, i.e., Nmin=2.

Then, the channel multiplexing unit may calculate the multiple of the number of the data of each transport channel to that of the transport channel 1 according to Step 602, i.e., K1=$\lfloor 2/2 \rfloor$=1, K2=$\lfloor 5/2 \rfloor$=2, K3=$\lfloor 6/2 \rfloor$=3.

Next, the channel multiplexing unit reads data from each transport channel following the method of Step 603, and the data read are A1, B1, B2, C1, C2, C3, A2, B3, B4, C4, C5, C6, B5. The channel multiplexing unit performs the $2^{nd}$ interleaving upon the data read and send the data interleaved to the wireless channel.

Correspondingly, the operations at the receiver when de-multiplexing the transport channels include:

Since the number of the data of each transport channel is known, the channel multiplexing unit de-interleaves the data received and then calculates out that K1=1, K2=2, and K3=3 according to Steps 601 and 602. Then, read data from the data de-interleaved, the numbers of the data read from the data de-interleaved is K1, K2 and K3 in turn, and write the data read into the transport channel 1, the transport channel 2 and the transport channel 3, respectively. When a transport channel has no data to be written, pass the transport channel and proceed to the next transport channel. Through this step, the data of the transport channels may be restored, and the transport channels are de-multiplexed.

Another method for data interleaving and data de-interleaving, against periodical position interference is provided, which adopts a manner of concatenated iterative interleaving. Although this method may bring delay, from the point of view of the whole transmission process, other delays including the transmission delay and the queuing delay are much larger than that brought by the interleaving. Therefore, the delay brought by the concatenated interleaving may be neglected during transmission. The process of the concatenated interleaving includes:

First, concatenate the data outputted from the transport channels, and input the data into the interleaving memory for interleaving. The algorithm of the interleaving is the same as that used in the background of the present invention. Refer to 3GPP TS25212 V5.4.0 for the detailed algorithm of the $2^{nd}$ interleaving. The data after the interleaving are as follows.

$$< A1B31B61C91C121C151 \quad A21B51B81C111C141C171 \quad \ldots \quad A18B48B78C108C138C168 >$$

Then, taking the data interleaved as the data to be interleaved, repeat the process of the interleaving again until the repeated times reach a user predefined time N. Then transmit the data interleaved to the wireless channel.

After receiving the data interleaved, the data receiver may restore the data by performing N times of the inverse operation, and then write the data into each transport channel. The process of the channel de-multiplexing will not be described herein. Refer to 3GPP TS25.212 V5.4.0 for details. The inverse operation includes: write the data received into an interweaving matrix of the interleaving memory column by column, permute the columns of the matrix inversely and read the data out row by row.

With the method provided by the embodiments of the present invention, the concatenated data of the transport channels inputted to a wireless channel after interleaving are not arranged periodically. Therefore, it is avoided that the data affected by a periodical interference in the wireless channel is of one transport channel. The data affected by the interference after de-interleaved are not concentrated into one transport channel, but in each transport channel randomly. That is, the positions of the data of different transport channels after interleaving are randomized and the unbalanced interference to each transport channel brought by the periodical position interference may be decreased significantly. Thereby, the performance of the decoding process is improved and thus the overall performance of the wireless link is improved.

The above-mentioned are only embodiments of the present invention, which are not used to confine the protection scope of the present invention. Various changes in form and in detail made without departing from the spirit and scope of the invention as defined by the appended claims are all covered in the protection scope of the present invention.

What is claimed is:

1. A method for data interleaving and data de-interleaving, comprising:
   a process of data interleaving by an interleaver, comprising:
      multiplexing data of different transport channels, interleaving the multiplexed data, and outputting the interleaved data; and
   a process of data de-interleaving comprising:
      receiving the interleaved data, de-interleaving the received interleaved data, and de-multiplexing the de-interleaved data into different transport channels;
      wherein a randomized operation is performed in the process of multiplexing data of different transport channels by a channel multiplexing unit, the randomized operation comprising:
         calculating a number of data of each transport channel, and recording a minimum number Nmin;
         calculating a multiple of the number of data of each transport channel to the Nmin, respectively, and rounding down the multiple to an integral multiple and recording the integral multiple;
         reading data from the transport channels until all the data of the transport channels are read, wherein a number of the data read from each transport channel each time equals to a corresponding integral multiple of each transport channel;
         if a number of data remaining in the transport channel is smaller than the rounded down multiple of the transport channel, reading the data remaining; and
      an inverse operation of the randomized operation is used in the process of de-multiplexing the data de-interleaved into different transport channels by a channel de-multiplexing unit, the inverse operation comprising:
         calculating the number of data of each transport channel, and recording the minimum number Nmin;
         calculating a multiple of the number of data of each transport channel to the Nmin, respectively, and rounding down the multiple to an integral multiple and recording the integral multiple;
         reading the de-interleaved data, and writing the data read into each corresponding transport channel until all the data are written, wherein the number of the data read each time equals to the integral multiple of each transport channel, and if a number of data to be written of a transport channel is smaller than the integral multiple of the transport channel, writing available data.

2. The method of claim 1, wherein the process of interleaving the data comprises:
   writing the data to be interleaved into an interleaving matrix of an interleaving memory row by row, permuting columns of the interleaving matrix and reading out the data column by column; and
   the inverse operation of the interleaving comprises:
      writing the received data into the interleaving matrix of a de-interleaving memory column by column, permuting the columns inversely and reading the data out row by row.

3. A method for data interleaving, comprising:
   multiplexing data of different transport channels, interleaving the data multiplexed by an interleaver, and outputting the interleaved data;
   performing a randomized operation in the process of multiplexing data of different transport channels, the randomized operation comprising:
      calculating a number of data of each transport channel, and recording a minimum number Nmin;
      calculating a multiple of the number of data of each transport channel to the Nmin, and rounding down the multiple of each transport channel to an integral multiple and recording the integral multiple respectively;
      reading data from the transport channels until the data of the transport channels are read, a number of data read from each transport channel each time equals the corresponding integral multiple of each transport channel; and
      if a number of data remaining of a transport channel is smaller than the rounded down multiple of the transport channel, reading the remaining data.

4. The method of claim 3, wherein the process of interleaving the data to be interleaved comprises:
   writing the data to be interleaved into an interleaving matrix of an interleaving memory row by row, permuting columns of the interleaving matrix and reading out the data column by column.

5. An apparatus for data interleaving, comprising:
   a channel multiplexing unit, configured to multiplex data of different transport channels;
   an interleaver, configured to receive data multiplexed from the channel multiplexing unit, interleave the received data and output interleaved date, wherein:
      the channel multiplexing unit is further configured to:
         calculate a number of data of each transport channel, and record a minimum number Nmin; calculate a multiple of the number of data of each transport channel to the Nmin, and round down the multiple of each transport channel to an integral multiple and recording the integral multiple respectively;
         read data from the transport channels until all the data of the transport channels are read, a number of data read from each transport channel each time equals to the corresponding integral multiple of each transport channel; and
         if a number of data remaining in a transport channel is smaller than a rounded down multiple of the transport channel, read the remaining data.

* * * * *